United States Patent
Huang et al.

(10) Patent No.: US 9,281,054 B2
(45) Date of Patent: Mar. 8, 2016

(54) TECHNIQUE FOR OPTIMIZING STATIC RANDOM-ACCESS MEMORY PASSIVE POWER CONSUMPTION

(71) Applicant: NVIDIA Corporation, Santa Clara, CA (US)

(72) Inventors: Yongchang Huang, Shanghai (CN); Jiping Ma, Shanghai (CN); Xiangning Shi, Shanghai (CN)

(73) Assignee: NVIDIA Corporation, Santa Clara, CA (US)

( * ) Notice: Subject to any disclaimer, the term of this patent is extended or adjusted under 35 U.S.C. 154(b) by 113 days.

(21) Appl. No.: 13/680,674

(22) Filed: Nov. 19, 2012

(65) Prior Publication Data

US 2014/0143485 A1    May 22, 2014

(51) Int. Cl.
| | |
|---|---|
| *G11C 7/12* | (2006.01) |
| *G11C 11/418* | (2006.01) |
| *G11C 8/08* | (2006.01) |
| *G11C 11/417* | (2006.01) |
| G11C 11/408 | (2006.01) |
| G11C 11/4091 | (2006.01) |

(52) U.S. Cl.
CPC ............ *G11C 11/418* (2013.01); *G11C 7/12* (2013.01); *G11C 8/08* (2013.01); *G11C 11/417* (2013.01); *G11C 11/4085* (2013.01); *G11C 11/4091* (2013.01); *Y02B 60/1225* (2013.01)

(58) Field of Classification Search
CPC .......... G11C 7/1072; G11C 7/12; G11C 8/08; G11C 11/4085; G11C 11/4091
USPC .................................................. 711/104, 160
See application file for complete search history.

(56) References Cited

U.S. PATENT DOCUMENTS

| | | | |
|---|---|---|---|
| 2009/0106505 A1* | 4/2009 | Rao | 711/154 |
| 2009/0157983 A1* | 6/2009 | Bowyer | 711/154 |
| 2010/0070709 A1* | 3/2010 | Mekhiel | 711/122 |
| 2010/0070742 A1* | 3/2010 | Dowling | 712/225 |

* cited by examiner

*Primary Examiner* — Than Nguyen
(74) *Attorney, Agent, or Firm* — Artegis Law Group, LLP

(57) ABSTRACT

A static read-only memory (SRAM) includes one or more bit cell rows that each includes a collection of bit cells. Each bit cell row is coupled to two or more different wordlines, where each wordline associated with a given bit cell row provides memory access to a different subset of bit cells within that bit cell row.

22 Claims, 3 Drawing Sheets

TECHNIQUE FOR OPTIMIZING STATIC RANDOM-ACCESS MEMORY PASSIVE POWER CONSUMPTION

BACKGROUND OF THE INVENTION

1. Field of the Invention

The present invention generally relates to static random-access memory (SRAM), and, more specifically, to a technique for optimizing SRAM passive power consumption.

2. Description of the Related Art

A conventional SRAM module includes one or more bit cell rows that each includes a collection of bit cells. Each bit cell within a given bit cell row is configured to store an individual bit of data, i.e. a logical "0" or "1." A wordline coupled to the bit cell row provides write and read access to all of the bit cells within that row.

When performing a memory access operation, the bit lines of all the columns in the bit cell row are pre-changed before the memory access operation can take place. The SRAM may then perform the memory access operation by asserting a column select signal with the targeted bit cells. The memory access operation could be, e.g., a write operation that involves writing a word of data to the targeted bit cells, or a read operation that involves reading a word of data from the targeted bit cells. During a read operation, all the bit cells are activated and thus the bit line of all columns are discharged. During a write operation, the bit lines of targeted bit cells are written with a desired value and all other bit lines undergo a passive read, and these non-targeted cells dissipate excess power.

A given bit cell row may include numerous bit cells capable of storing multiple different words of data. However, when a memory access operation requires access to just one of those words of data, the SRAM module must enable the wordline for the entire row, thereby pre-charging all of the bit cells within that row. This approach is problematic because enabling bit cells that are not required for the memory access operation wastes power.

Accordingly, what is needed in the art is a more effective technique for performing memory access operations with an SRAM module.

SUMMARY OF THE INVENTION

One embodiment of the present invention includes a computer-implemented method for performing a memory access operation with a memory module, including identifying a row of bit cells residing within the memory module, determining that the memory access operation involves a subset of bit cells within the row of bit cells, enabling the subset of bit cells via a wordline coupled to the subset of bit cells, and performing the memory access operation with the subset of bit cells.

One advantage of the disclosed technique is that the memory module is capable of performing memory access operations with a portion of the bit cells within a given bit cell row without pre-charging the bit-lines of all remaining columns, thereby conserving power.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
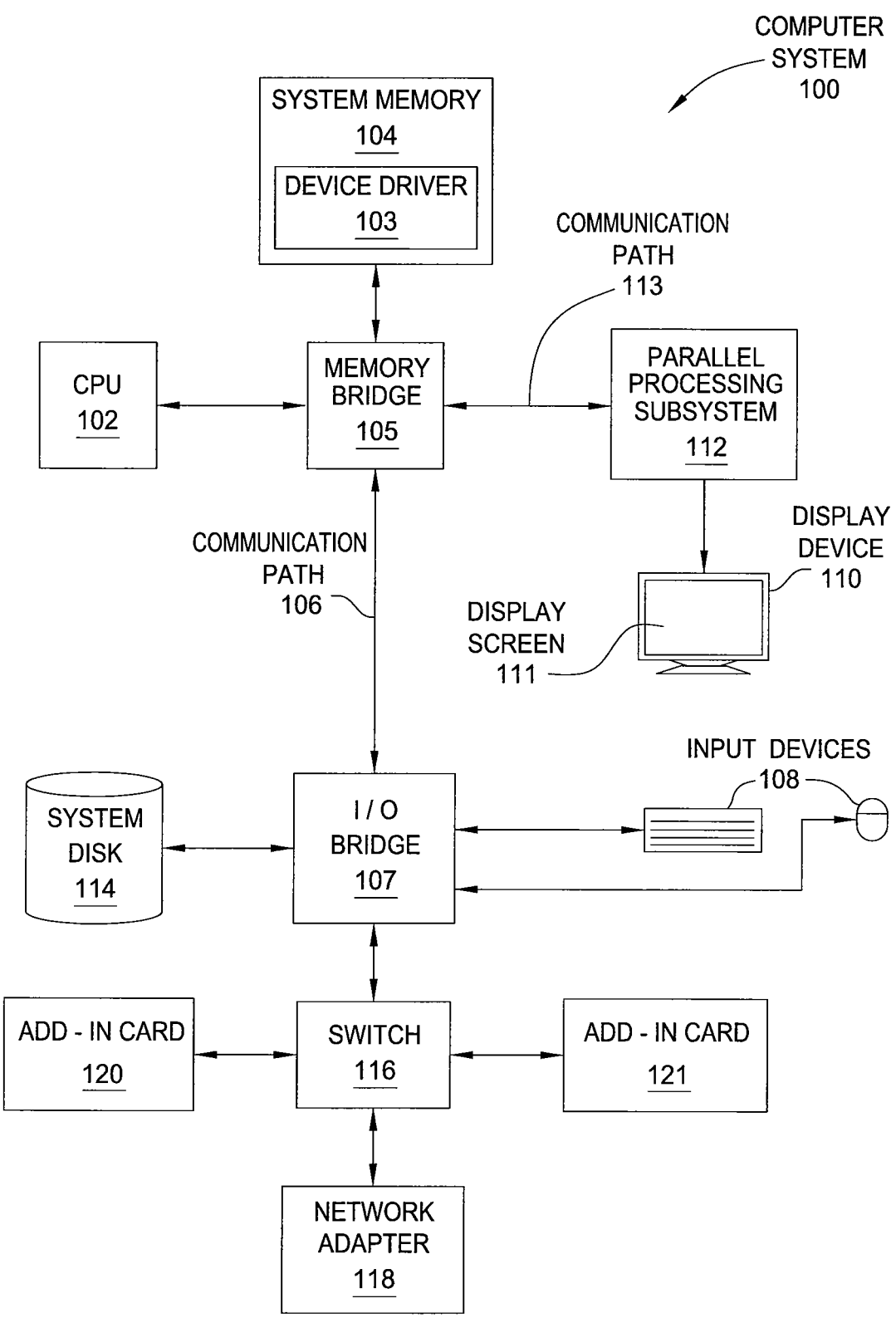
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 that includes a device driver 103. CPU 102 and system memory 104 communicate via an interconnection path that may include a memory bridge 105. Memory bridge 105, which may be, e.g., a Northbridge chip, is connected via a bus or other communication path 106 (e.g., a HyperTransport link) to an input/output (I/O) bridge 107. I/O bridge 107, which may be, e.g., a Southbridge chip, receives user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a peripheral component interconnect (PCI) express, Accelerated Graphics Port (AGP), or HyperTransport link); in one embodiment parallel processing subsystem 112 is a graphics subsystem that delivers pixels to a display device 110 (e.g., a conventional cathode ray tube (CRT) or liquid crystal display (LCD) based monitor). A system disk 114 is also connected to I/O bridge 107. A switch 116 provides connections between I/O bridge 107 and other components such as a network adapter 118 and various add-in cards 120 and 121. Other components (not explicitly shown), including universal serial bus (USB) or other port connections, compact disc (CD) drives, digital video disc (DVD) drives, film recording devices, and the like, may also be connected to I/O bridge 107. Communication paths interconnecting the various components in FIG. 1 may be implemented using any suitable protocols, such as PCI, PCI Express (PCIe), AGP, HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip. Large embodiments may include two or more CPUs 102 and two or more parallel processing systems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

In one embodiment, parallel processing subsystem 112 includes one or more parallel processing unit (PPUs) each of which includes one or more SRAM modules. A given PPU may read data from or write data to an SRAM module coupled to that PPU. In various other embodiments, system memory 104 and/or other memory units within computer system 100 include one or more SRAM modules. Each such SRAM module may be implemented by the SRAM module described below in conjunction with FIGS. 2 and 3.

SRAM Passive Power Optimization

Figure 2:
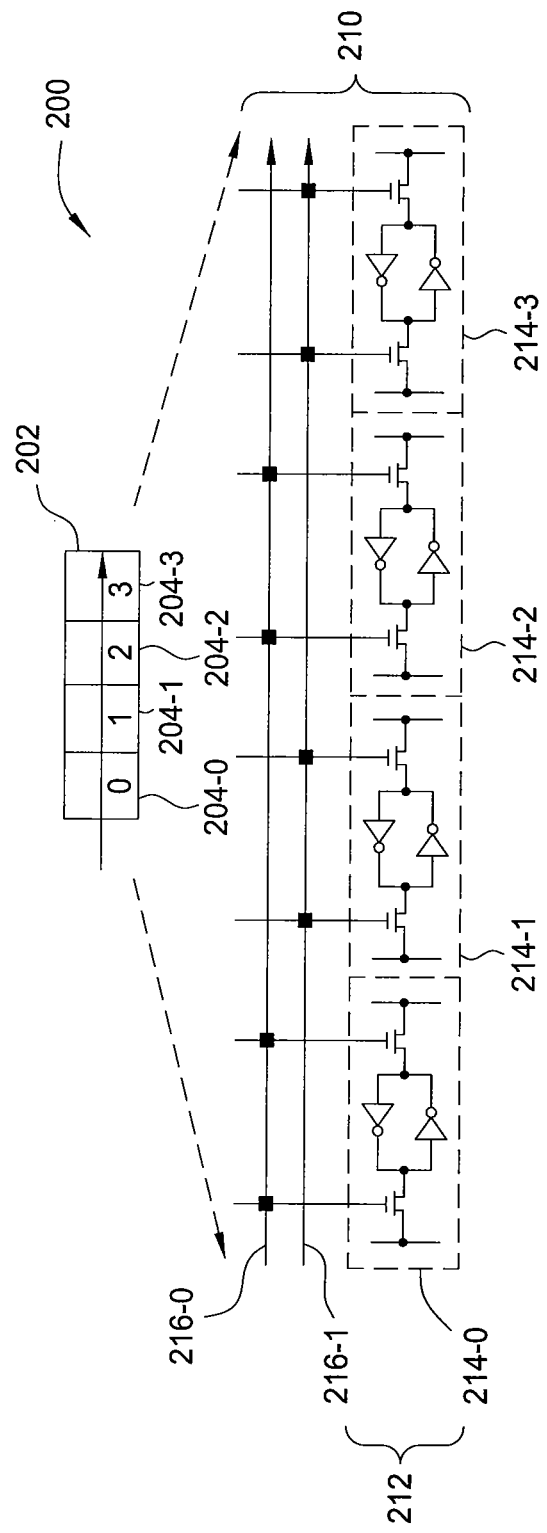
FIG. 2 is a conceptual diagram that illustrates an SRAM module configured to store a word of data, according to one embodiment of the present invention.

FIG. 2 is a conceptual diagram 200 that illustrates an SRAM module 210 configured to store a word of data, according to one embodiment of the present invention. SRAM module 210 may reside within system memory 104 shown in FIG. 1 and/or memory coupled to PPUs within parallel processing subsystem 112, also shown in FIG. 1. As shown, SRAM module 210 includes a bit cell row 212 that, in turn, includes bit cells 214-0, 214-1, 214-2, and 214-3. Each bit cell 214 within bit cell row 212 is configured to store a bit of data, i.e. a logical "0" or "1." SRAM module also includes wordlines 216-0 and 216-1. Wordlines 216-0 and 216-1 are coupled to different groups of bit cells 214 and configured to provide read and write access to specific groups of bit cells 214. Wordline 216-0 is coupled to bit cells 214-0 and 214-2 and configured to provide write and read access to those bit cells. Likewise, wordline 216-1 is coupled to bit cells 214-1 and 214-3 and configured to provide write and read access to those bit cells. Accordingly, wordline 216-0 can be used to access even-indexed bit cells 214, while wordline 216-1 may be used to access odd-indexed bit cells 214. With this configuration, SRAM module 210 is configured to access a portion of bit cells 214 within bit cell row 212 without pre-charging the remaining portion of bit cells 214 within that bit cell row.

In one exemplary scenario, SRAM module 210 is configured to write a word of data included within a bit string 202 to bit cells 214. As shown, bit string 202 includes bits 204-0, 204-1, 204-2, and 204-3. In this example, bit string includes just four bits of data, although bit string 202 may, in practice, include any number of bits 204. Bits 204 within bit string 202 may be organized into one or more different words. Bit string 202 could, for example, include two words, a first word that includes bits 204-0 and 204-2 and a second word that includes bits 204-1 and 204-3.

When SRAM module 210 writes a word of data that includes bits 204-0 and 204-2, SRAM module 210 is configured to enable bit cells 214-0 and 214-2 via wordline 216-0 and to then write bits 204-0 and 204-2, respectively, to those bit cells. Likewise, when SRAM module 210 writes a word of data that includes bits 204-1 and 204-3, SRAM module 210 is configured to enable bit cells 214-1 and 214-3 via wordline 216-1 and to then write bits 204-1 and 204-3, respectively, to those bit cells. In general, when SRAM module 210 writes a word of data having even-indexed bits, SRAM module 210 is configured to only pre-charge even-indexed bit cells 214. Similarly, when SRAM module 210 writes a word of data having odd-indexed bits, SRAM module 210 is configured to only pre-charge odd-indexed bit cells 214.

In another exemplary scenario, SRAM module 210 is configured to read a word of data from bit cells 214. When the word of data resides within even-indexed bit cells 214, such as bit cells 214-0 and 214-2, SRAM 210 is configured to enable those bit cells via wordline 216-0 without enabling the bit cells coupled to wordline 216-1. Likewise, when the word of data resides within odd-indexed bit cells 214, such as bit cells 214-1 and 214-3, SRAM 210 is configured to enable those bit cells via wordline 216-1 without enabling bit cells coupled to wordline 216-1. In general, when SRAM module 210 reads a word of data residing at even-indexed bit cells 214, SRAM module 210 is configured to only pre-charge those even-indexed bit cells 214. Similarly, when SRAM module 210 reads a word of data residing at odd-indexed bit cells 214, SRAM module 210 is configured to only pre-charge those odd-indexed bit cells 214.

Persons skilled in the art will understand that SRAM 210 represents just one possible implementation of the present invention, and that other implementations are also possible. For example, SRAM module 210 could have any number of different bit cell rows 212, and a given bit cell row 212 could have any number of bit cells 214. Moreover, each such bit cell row 212 could be coupled to more than two different wordlines 216. For example, a given bit cell row 212 could be coupled to first, second, and third wordlines that each provided read and write access to a different subset of bit cells 214 within that bit cell row 212. Additionally, the techniques described above may be implemented with SRAM modules having any technically feasible column multiplexing configuration. Finally, persons skilled in the art will recognize that the exemplary scenarios discussed above are provided for exemplary purposes only, and that SRAM module 210 is capable of storing words of data having any number of bits 204.

Figure 3:
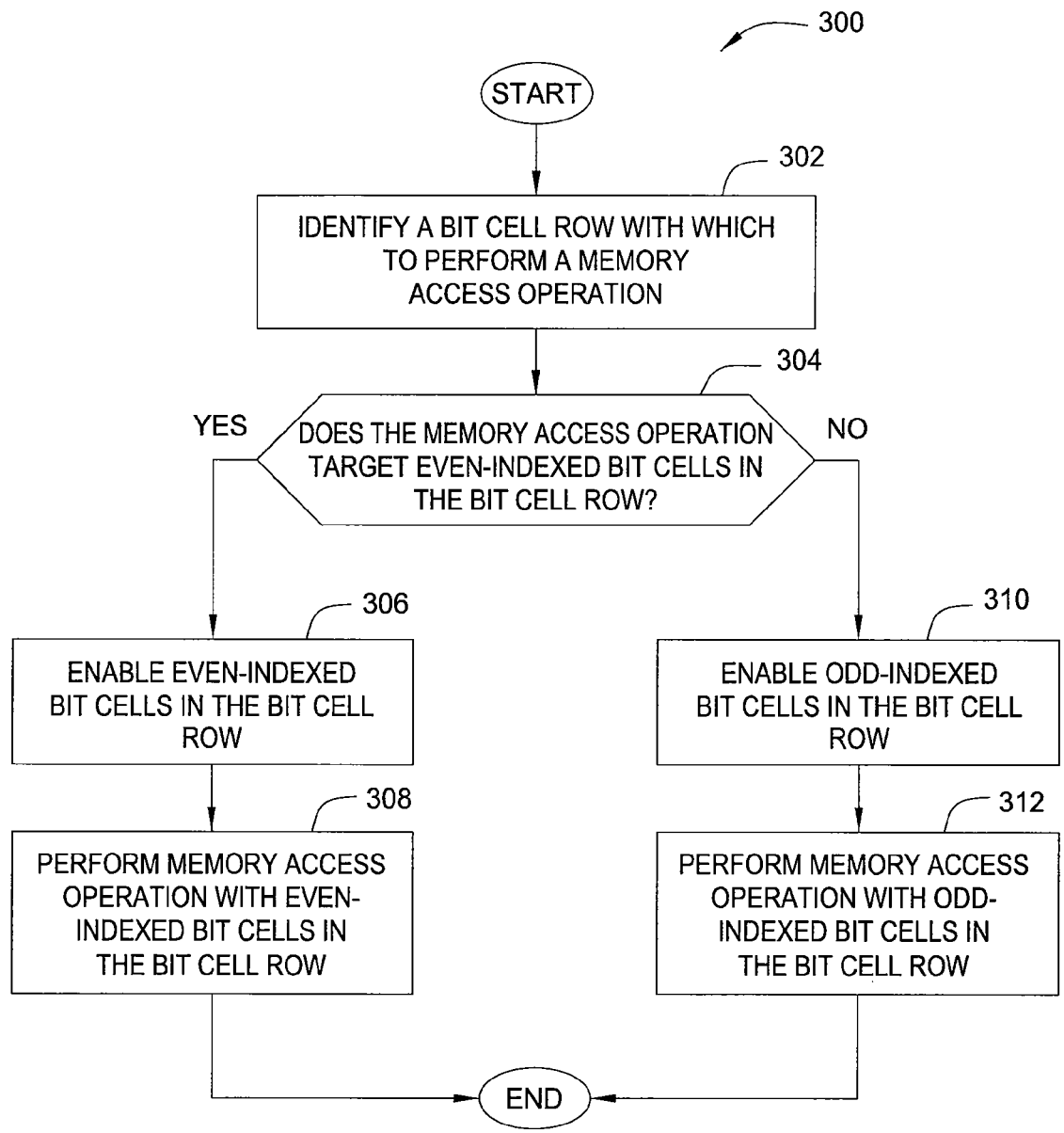
FIG. 3 is a flow diagram of method steps for performing a memory access operation with the SRAM module of FIG. 2, according to one embodiment of the invention.

FIG. 3 is a flow diagram of method steps for performing a memory access operation with SRAM module 210 of FIG. 2, according to one embodiment of the invention. Although the method steps are described in conjunction with the systems of FIGS. 1 and 2, persons skilled in the art will understand that any system configured to perform the method steps, in any order, is within the scope of the present invention. In one embodiment, SRAM module 210, for example, may be configured to perform the method steps described below.

As shown, a method 300 begins at step 302, where SRAM module 210 identifies a bit cell row with which to perform the memory access operation. The bit cell row could be, e.g. bit cell row 212 shown in FIG. 2. The memory access operation could be a write operation or a read operation. SRAM module 210 may perform step 302 by implementing using any technically feasible approach for identifying a specific bit cell row for a given memory access operation. At step 304, SRAM module 210 determines whether the memory access operation targets even-indexed bit cells in the bit cell row.

If SRAM 210 determines at step 304 that the memory access operation targets even-indexed bit cells in the bit cell row, such as, e.g. bit cells 214-0 and 214-2 shown in FIG. 2, then the method 300 proceeds to step 306. At step 306, SRAM 210 enables the even-indexed bit cells of the bit cell row. At step 308, SRAM module 210 performs the memory access operation with the even-indexed bit cells in the bit cell row.

If SRAM 210 determines at step 304 that the memory access operation does not target even-indexed bit cells in the bit cell row, and instead targets odd-indexed bit cells, such as, e.g. bit cells 214-1 and 214-3 shown in FIG. 2, then the method 300 proceeds to step 310. At step 310, SRAM 210 enables the odd-indexed bit cells of the bit cell row. At step 312, SRAM module 210 performs the memory access operation with the odd-indexed bit cells in the bit cell row.

By implementing this technique, SRAM module 210 is configured to access even-indexed bit cells 214 within bit cell row 212 without pre-charging the odd-indexed bit cells 214 within that bit cell row. Similarly, SRAM module 210 is configured to access odd-indexed bit cells 214 within bit cell row 212 without pre-charging the even-indexed bit cells 214 within that bit cell row. Persons skilled in the art will recognize the technique described in conjunction with FIG. 3 could be applied to a bit cell row having any number of different wordlines, each such wordline providing access to a different subset of bit cells within the bit cell row.

In sum, a static read-only memory (SRAM) includes one or more bit cell rows that each includes a collection of bit cells. Each bit cell row is coupled to two or more different wordlines, where each wordline associated with a given bit cell row provides memory access to a different subset of bit cells within that bit cell row.

Advantageously, the SRAM module is capable of performing memory access operations with a portion of the bit cells within a given bit cell row without pre-charging the remaining portion of bit cells within that bit cell row, thereby conserving power.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A computer-implemented method for performing a memory access operation with a memory module, the method comprising:

identifying a row of bit cells residing within the memory module;

determining that the memory access operation involves a subset of bit cells within the row of bit cells, wherein each bit cell in the subset of bit cells is indexed with a numerical value having a first parity;

pre-charging the subset of bit cells via a wordline coupled to the subset of bit cells without pre-charging bit cells within the row of bit cells indexed with a numerical value having a second parity; and performing the memory access operation with the subset of bit cells.

2. The computer-implemented method of claim 1, wherein each bit cell within the row of bit cells is indexed with a numerical value, a first subset of bit cells within the row of bit cells is indexed with an even numerical value and coupled to a first wordline that is configured to pre-charge the first subset of bit cells, and a second subset of bit cells within the row of bit cells is indexed with an odd numerical value and coupled to a second wordline that is configured to pre-charge the second subset of bit cells.

3. The computer-implemented method of claim 2, wherein the subset of bit cells comprises the first subset of bit cells, the wordline comprises the first wordline, and the memory access operation comprises a read operation that targets the first subset of bit cells.

4. The computer-implemented method of claim 2, wherein the subset of bit cells comprises the second subset of bit cells, the wordline comprises the second wordline, and the memory access operation comprises a read operation that targets the second subset of bit cells.

5. The computer-implemented method of claim 2, wherein the subset of bit cells comprises the first subset of bit cells, the wordline comprises the first wordline, and the memory access operation comprises a write operation that targets the first subset of bit cells.

6. The computer-implemented method of claim 2, wherein the subset of bit cells comprises the second subset of bit cells, the wordline comprises the second wordline, and the memory access operation comprises a write operation that targets the second subset of bit cells.

7. The computer-implemented method of claim 1, wherein the memory module comprises a column-multiplexed memory module including multiple rows of bit cells, wherein each row of bit cells of the column-multiplexed memory module is coupled to two or more wordlines, and wherein each wordline associated with a given row of bit cells is configured to access a different subset of bit cells in the given row of bit cells.

8. The computer-implemented method of claim 1, wherein the memory module comprises static random-access memory (SRAM).

9. The method of claim 1, wherein only the subset of bit cells is pre-charged prior to the memory access operation being performed.

10. The computer-implemented method of claim 1, wherein the subset of bit cells is interleaved with another subset of bit cells that is not pre-charged via the wordline.

11. A system for performing a memory access operation with a memory module, including:

the memory module, configured to:

identify a row of bit cells residing within the memory module;

determine that the memory access operation involves a subset of bit cells within the row of bit cells, wherein each bit cell in the subset of bit cells is indexed with a numerical value having a first parity;

pre-charge the subset of bit cells via a wordline coupled to the subset of bit cells without pre-charging bit cells within the row of bit cells indexed with a numerical value having a second parity; and perform the memory access operation with the subset of bit cells.

12. The system of claim 11, wherein each bit cell in the row of bit cells is indexed with a numerical value, a first subset of bit cells within the row of bit cells is indexed with an even numerical value and coupled to a first wordline that is configured to pre-charge the first subset of bit cells, and a second subset of bit cells within the row of bit cells is indexed with an odd numerical value and coupled to a second wordline that is configured to pre-charge the second subset of bit cells.

13. The system of claim 12, wherein the subset of bit cells comprises the first subset of bit cells, the wordline comprises the first wordline, and the memory access operation comprises a read operation that targets the first subset of bit cells.

14. The system of claim 12, wherein the subset of bit cells comprises the second subset of bit cells, the wordline comprises the second wordline, and the memory access operation comprises a read operation that targets the second subset of bit cells.

15. The system of claim 12, wherein the subset of bit cells comprises the first subset of bit cells, the wordline comprises the first wordline, and the memory access operation comprises a write operation that targets the first subset of bit cells.

16. The system of claim 12, wherein the subset of bit cells comprises the second subset of bit cells, the wordline comprises the second wordline, and the memory access operation comprises a write operation that targets the second subset of bit cells.

17. The system of claim 11, wherein the memory module comprises a column-multiplexed memory module including multiple rows of bit cells, wherein each row of bit cells of the column-multiplexed memory module is coupled to two or more wordlines, and wherein each wordline associated with a given row of bit cells is configured to access a different subset of bit cells in the given row of bit cells.

18. The system of claim 11, wherein the memory module comprises static random-access memory (SRAM).

19. The system of claim 11, wherein only the subset of bit cells is pre-charged prior to the memory access operation being performed.

20. A computing device configured to perform a memory access operation with a memory module, including:

the memory module, configured to:

identify a row of bit cells residing within the memory module;

determine that the memory access operation involves a subset of bit cells within the row of bit cells, wherein each bit cell in the subset of bit cells is indexed with a numerical value having a first parity;

pre-charge the subset of bit cells via a wordline coupled to the subset of bit cells without pre-charging bit cells within the row of bit cells indexed with a numerical value having a second parity; and perform the memory access operation with the subset of bit cells.

21. The computing device of claim 20, wherein the memory module comprises static random-access memory (SRAM).

22. The computing device of claim 20, wherein only the subset of bit cells is pre-charged prior to the memory access operation being performed.

\* \* \* \* \*